United States Patent
Wu et al.

(10) Patent No.: US 8,310,065 B2
(45) Date of Patent: Nov. 13, 2012

(54) SEMICONDUCTOR DEVICE AND WAFER STRUCTURE

(75) Inventors: Hui-Min Wu, Hsinchu County (TW); Bang-Chiang Lan, Taipei (TW); Chien-Hsin Huang, Taichung (TW); Kuan-Yu Wang, Taipei County (TW); Chao-An Su, Kaohsiung County (TW); Tzung-I Su, Yun-Lin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 92 days.

(21) Appl. No.: 12/985,344

(22) Filed: Jan. 6, 2011

(65) Prior Publication Data

US 2012/0175778 A1    Jul. 12, 2012

(51) Int. Cl.
*H01L 23/48*    (2006.01)
(52) U.S. Cl. ........ 257/780; 257/773; 257/774; 257/781; 257/784; 257/E21.577
(58) Field of Classification Search ................. 257/773, 257/776, 780, 781, 782, 783, 784, E23.017, 257/E21.575; 438/618
See application file for complete search history.

(56) References Cited

U.S. PATENT DOCUMENTS

| | | | |
|---|---|---|---|
| 6,265,328 B1 | 7/2001 | Henley | |
| 6,577,017 B1 * | 6/2003 | Wong | 257/774 |
| 6,650,021 B2 * | 11/2003 | Stamper et al. | 257/786 |
| 6,841,848 B2 | 1/2005 | MacNamara | |
| 6,933,614 B2 * | 8/2005 | Lee et al. | 257/780 |
| 7,129,172 B2 | 10/2006 | Morrow | |
| 2011/0057288 A1 * | 3/2011 | Tan et al. | 257/503 |
| 2011/0068374 A1 * | 3/2011 | Tan et al. | 257/254 |
| 2011/0084399 A1 * | 4/2011 | Furumiya et al. | 257/774 |

FOREIGN PATENT DOCUMENTS

JP    10335195    12/1998
* cited by examiner

*Primary Examiner* — Jasmine Clark
(74) *Attorney, Agent, or Firm* — Winston Hsu; Scott Margo

(57) ABSTRACT

A fabrication method of a wafer structure includes: providing a substrate having a plurality of die regions and an edge region surrounding the die regions defined thereon; then, forming a dielectric layer, a plurality of MEMS devices, a plurality of metal-interconnect structures and a plurality bonding pads on the substrate in the die regions; next, removing the dielectric layer disposed on the substrate of the edge region to expose the substrate; and thereafter, forming a passivation layer to cover the substrate and the dielectric layer.

13 Claims, 6 Drawing Sheets

SEMICONDUCTOR DEVICE AND WAFER STRUCTURE

BACKGROUND OF THE INVENTION

1. Field of the Invention

The present invention relates to a semiconductor device, a wafer structure and a fabrication method thereof, and more particularly, to a semiconductor device integrated with a micro-electro-mechanical system (MEMS) device and a logic device and a wafer structure and a fabrication method thereof.

2. Description of the Prior Art

Micro-electro-mechanical system (MEMS) technology is to fabricate micro mechanical devices by using conventional semiconductor technologies such as electroplating, etching such that a mechanical component in a micro-meter scale may be formed. The MEMS device may be, for example, the voltage controlling component in an ink printer, the gyroscope in a car to detect the tilt of the car, or the vibration membrane in a microphone to sense a sound. Therefore, the fabrication method of MEMS combines the fabrication process of the MEMS device with the fabrication process of the complementary metal-oxide-semiconductor (CMOS) device to integrate the MEMS device and the CMOS device into a single chip. In addition, the integrated chips can be fabricated on one wafer simultaneously, so that the MEMS technology which combines the fabrication process of the mechanical and the electronic devices has the advantages of low cost, high performance and high density.

In a integrated structure of the MEMS device and the MOS device, in order to fabricate the MEMS device that has a mechanical characteristic, such as vibration, a dielectric layer surrounding or covering the MEMS device should be removed, but in order to maintain operation of the MOS device used to transfer signals, the dielectric layer surrounding the MOS device and metal-interconnect structure should be retained. Since the process of removing the dielectric layer surrounding the MEMS device includes an isotropic etching process, various contaminations or blemishes resulting in damage of devices are often generated in the etching process to affect the operation of the MEMS device.

For this reason, to solve the problem of the MEMS device being affected by the isotropic etching process is an objective in industry.

SUMMARY OF THE INVENTION

It is therefore a primary objective of the present invention to provide a semiconductor device, a wafer structure and a fabrication method thereof to solve the above-mentioned problem of the MEMS device being affected by the isotropic etching process.

According to a preferred embodiment of the present invention, a fabrication method is provided. First, a substrate is provided, and the substrate has a plurality of die regions and an edge region surrounding the die regions defined thereon. The substrate has a dielectric layer, a plurality of MEMS devices, a plurality of metal-interconnect structures and a plurality of bonding pads, and the MEMS devices, the metal-interconnect structures and the bonding pads are disposed in the dielectric layer in the die regions. Then, the dielectric layer in the edge region is removed to expose the substrate in the edge region. Next, a passivation layer is formed to cover the dielectric layer and the exposed substrate.

According to another preferred embodiment of the present invention, a wafer structure is provided. The wafer structure comprises a substrate, a dielectric layer, a plurality of bonding pads and a passivation layer. The substrate has a plurality of die regions and an edge region surrounding the die regions defined thereon. The dielectric layer is disposed on the substrate in the die regions, and the bonding pads are disposed in the dielectric layer in the die regions. The dielectric layer has a plurality of first openings respectively exposing each bonding pad. The passivation layer covers the dielectric layer and a sidewall of the dielectric layer in the edge region, and extends to cover the substrate in the edge region.

According to another preferred embodiment of the present invention, a semiconductor device is provided. The semiconductor device comprises a substrate, a dielectric layer, at least one bonding pad, and a passivation layer. The substrate has a MEMS region and a non-MEMS region disposed thereon. The dielectric layer is disposed on the substrate in the non-MEMS region, and the bonding pad is disposed in the dielectric layer. The dielectric layer has at least one opening exposing the bonding pad. The passivation layer covers the dielectric layer. The passivation layer comprises a metal-atom-containing material, and is electrically insulated from the bonding pad.

The present invention provides the fabrication method of the wafer structure to first remove the dielectric layer in the edge region and form the passivation layer on the dielectric layer and the substrate before performing the isotropic etching process, so that the etchant used in the isotropic etching process do not etch the dielectric layer. Therefore, the dielectric layer on the edge of the substrate and a structure thereon can be prevented from being peeled off the substrate, and the MEMS device also can be prevented from being contaminated.

These and other objectives of the present invention will no doubt become obvious to those of ordinary skill in the art after reading the following detailed description of the preferred embodiment that is illustrated in the various figures and drawings.

DETAILED DESCRIPTION

In the process of removing the dielectric layer surrounding the MEMS device, a hard mask should be first used to cover the MOS device so that the MOS device and the metal-interconnect structure can be shielded, and then, an isotropic etching process is performed to remove the dielectric layer surrounding the MEMS device. However, the dielectric layer is extended to cover the edge of the whole wafer, and a top surface of the wafer is not exposed, so that the hard mask formed in the following step only can cover the top surface of the dielectric layer, but can not shield the sidewall of the dielectric layer at the wafer edge. In the isotropic etching process, the etchant not only etches the dielectric layer covering the MEMS device, but also etches the sidewall of the dielectric layer without being covered with the hard mask, especially the sidewall of the dielectric layer at the wafer edge. Thus, the dielectric layer at the wafer edge and the structure disposed thereon are peeled off the wafer, and the peeled particles are generated to contaminate the MEMS device. The present invention therefore proposes a novel semiconductor device, a wafer structure and fabrication method thereof to prevent the dielectric layer at the wafer edge and the structure disposed thereon from being peeled off the wafer and solve the problem of the devices being contaminated in the isotropic etching process.

Figure 1A:
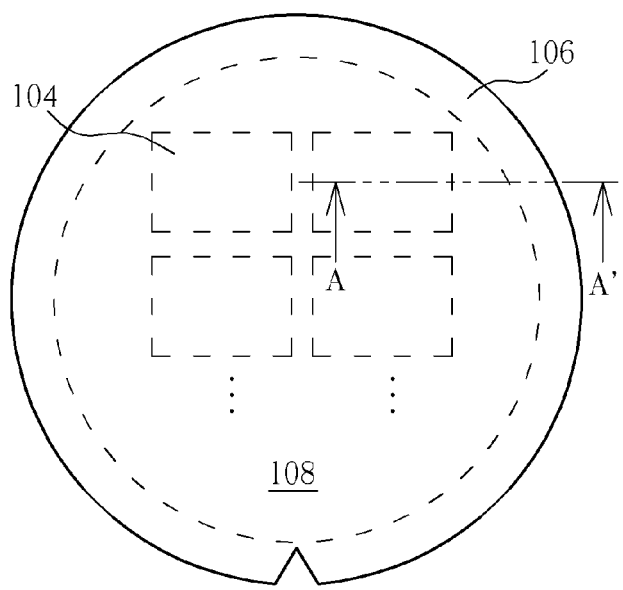
FIG. 1A through FIG. 5B are schematic diagrams illustrating a fabrication method of a wafer structure according to a preferred embodiment of the present invention.
Figure 1B:
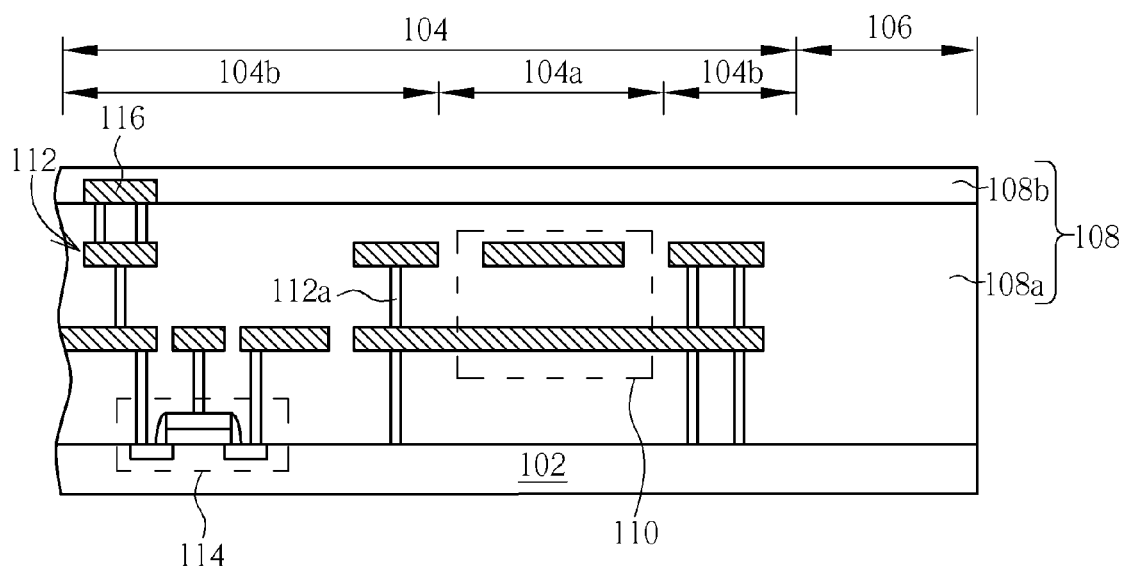

The present invention in one aspect provides a wafer structure and a fabrication method thereof. Please refer to FIG. 1A through FIG. 5B. FIG. 1A through FIG. 5B are schematic diagrams illustrating a fabrication method of a wafer structure according to a preferred embodiment of the present invention. FIG. 1B is a schematic diagram illustrating a cross-sectional view of FIG. 1A taken along line AA'. FIG. 2B is a schematic diagram illustrating a cross-sectional view of FIG. 2A taken along line AA'. FIG. 3B is a schematic diagram illustrating a cross-sectional view of FIG. 3A taken along line AA'. FIG. 4B is a schematic diagram illustrating a cross-sectional view of FIG. 4A taken along line AA'. FIG. 5B is a schematic diagram illustrating a cross-sectional view of FIG. 5A taken along line AA'. As shown in FIG. 1A and FIG. 1B, a substrate 102 is provided. In this embodiment, the substrate 102 is a silicon wafer, but is not limited to this. The substrate 102 of the present invention also can be a silicon on insulator (SOI) substrate. Furthermore, the substrate 102 has a plurality of die regions 104 and an edge region 106 surrounding the die regions 104 defined thereon, and the substrate 102 has a dielectric layer 108, a plurality of MEMS devices 110, a plurality of metal-interconnect structures 112, a plurality of logic devices 114 and a plurality of bonding pads 116. The MEMS devices 110, the metal-interconnect structures 112, the logic devices 114 and the bonding pads 116 are disposed in the die regions 104, and the dielectric layer 108 covers the MEMS devices 110, the metal-interconnect structures 112, the logic devices 114 and the bonding pads 116. The edge region 106 is a region close to a wafer edge, and each die region 104 can be divided into a MEMS region 104a and a non-MEMS region 104b. In addition, the MEMS regions 104a are used to form the MEMS devices 110 having mechanical characteristics, and the non-MEMS regions 104b are used to form the devices that do not need the mechanical characteristics, such as the metal-interconnect structures 112 electrically connecting the MEMS devices 110 to the outside, the bonding pads 116 used to bear the bonding of the metal wire, and the logic devices 114 used to control the MEMS devices 110 or receive the signals transferred from the MEMS devices 110, etc. The logic devices 114 of this embodiment can be a metal-oxide-semiconductor (MOS) transistor, but is not limited to this. The logic devices 114 of the present invention also can be memory devices, field effect transistors, bipolar junction transistors, high voltage devices or a combination thereof. In this embodiment, each non-MEMS device 104b has one logic device 114, one metal-interconnect structure 112 and a plurality of bonding pads 116 formed therein, but the present invention is not limited to this. The number of the logic device 114 and the metal-interconnect structure 112 also can be plurality, and the number of the bonding pad 116 also can be only one in each non-MEMS region 104b. The numbers of the logic device 114, the metal-interconnect structure 112 and the bonding pad 116 in the present invention can be chosen according to the requirements. In addition, the step of forming the MEMS devices 110, the metal-interconnect structures 112, the logic devices 114 and the bonding pads 116 includes forming several different insulating layers to define positions of different devices. For this reason, the dielectric layer 108 includes an inter-layer dielectric (ILD) layer constituted by a plurality of inter-metal dielectric (IMD) layers, and can be a multilayer structure. The material of forming the inter-metal dielectric layer includes tetra-ethyl-ortho-silicate (TEOS), fluoride silicate glass (FSG), undoped silicate glass (USG), borophosphosilicate glass (BPSG), silicon carbide (SiC) or silicon oxynitride (SiON), etc., but is not limited herein. Furthermore, the dielectric layer 108 further includes a cap layer 108b, disposed on the ILD layer 108a. The material of forming the cap layer 108b includes silicon nitride, but is not limited to this. Each metal-interconnect structure 112 can further include at least one barrier 112a, disposed in the dielectric layer 108 of the non-MEMS regions 104b close to the MEMS regions 104a, and the barrier can be used to stop an etching process in the following step for removing the dielectric layer 108 in the MEMS regions 104a from etching the logic devices 114. The step of forming the MEMS devices 110, the metal-interconnect structures 112, the logic devices 114 and the bonding pads 116 is well known by those skilled in the art, and the details of which are not further explained herein for the sake of brevity.

Figure 2A:
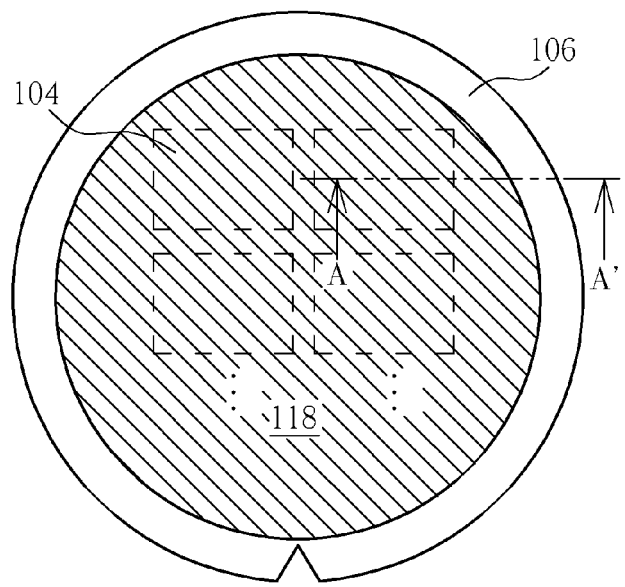
Figure 2B:
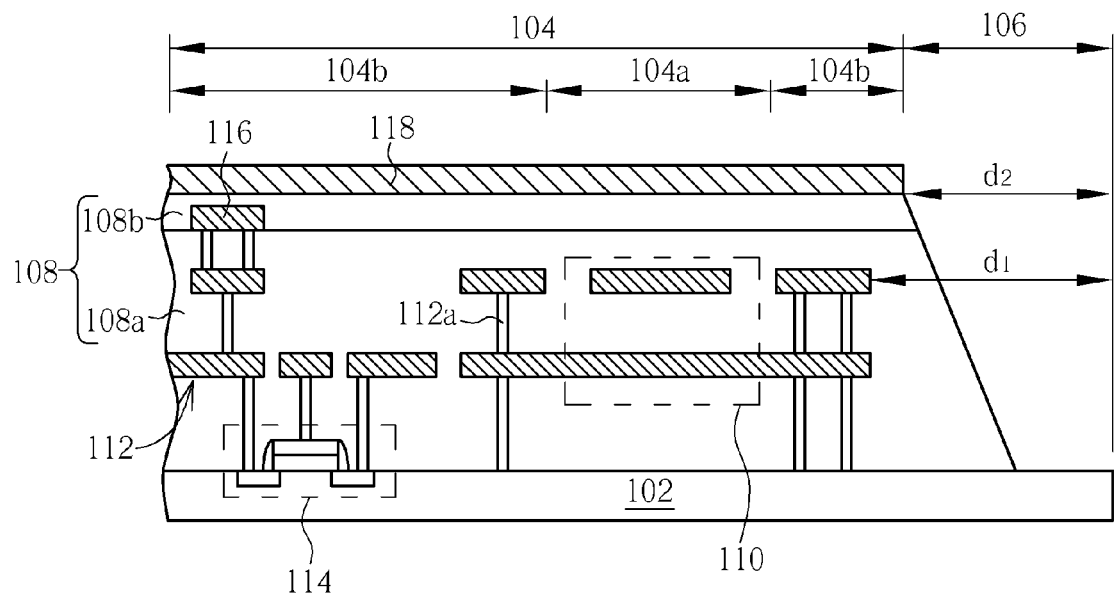

Next, as shown in FIG. 2A and FIG. 2B, a patterned photoresist layer 118 is formed on the dielectric layer 108, and the patterned photoresist layer 118 covers the dielectric layer 108 in all die regions 104 on the substrate 102 and exposes the dielectric layer 108 in the edge region 106. Then, an etching process is performed to remove the dielectric layer 108 in the edge region 106, so that the substrate 102 at the wafer edge is exposed, and the dielectric layer 108 does not completely cover the substrate 102. A sidewall of the dielectric layer 108 is disposed on the substrate 102 in the edge region 106. Because the dielectric layer 108 has a certain thickness due to including several IMD layers, the etching process of this embodiment is preferably a deep reactive ion etching (DRIE) process, but the present invention is not limited to this. The etching process in the present invention also can utilize a dry etching process or a wet etching process. When the etching process is the DRIE process, the sidewall of the dielectric layer 108 in the edge region 106 is an inclined sidewall. It should be noted that one of the metal-interconnect structure 112 and an edge of the substrate 102 have a first distance $d_1$ in a horizontal direction, and a top end of the sidewall of the dielectric layer 108 in the edge region 106 and the edge of the substrate 102 have a second distance $d_2$ in the horizontal direction. The first distance $d_1$ is larger than the second distance $d_2$. Accordingly, the etching process only removes the dielectric layer 108 in the edge region 106, and do not damage or affect the MEMS devices 110, the metal-interconnect structures 112, the logic devices 114 and the bonding pads 116 in the die regions 104. In addition, the dielectric layer 108 in the edge region 106 of the present invention preferably do not have the MEMS devices 110, the metal-interconnect structures 112, the logic devices 114 and the bonding pads 116 disposed therein.

Figure 3A:
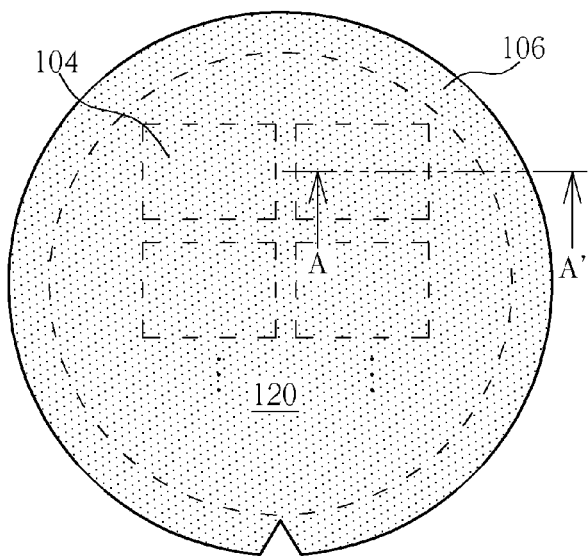
Figure 3B:
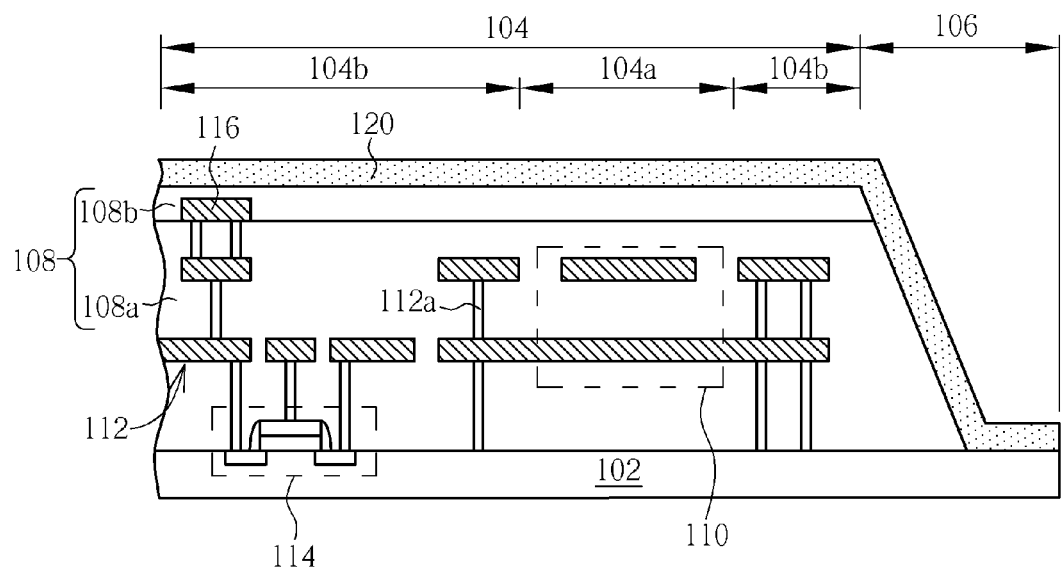

Thereafter, as shown in FIG. 3A and FIG. 3B, the patterned photoresist layer 118 is removed, and then, a continuous passivation layer is formed to cover a top surface and the sidewall of the dielectric layer 108 and the exposed substrate 102, so that the passivation layer 120 can be used to resist an etchant used to remove the whole dielectric layer 108 in the MEMS region 104a in the following step. The passivation layer 120 covers the top surface of the dielectric layer 108 and the sidewall of the dielectric layer 108 in the edge region 106, and extends to cover the substrate 102 in the edge region 106. Even a top surface of the whole substrate 102 is completely covered with the passivation layer 120, so that a joint surface of the sidewall of the dielectric layer 108 and the substrate 102 can be completely covered with the passivation layer 120. A material of forming the passivation layer 120 includes a metal-atom-containing material, such as metal or metal nitride, such as titanium nitride (TiN) or tantalum nitride (TaN), etc., and the metal includes tungsten (W), aluminum (Al) or titanium (Ti), etc., but the present invention is not limited to this. In the present invention, the material of the passivation layer 120 also can be polyimide, and a material of the passivation layer 120 can be chosen according to the material of the etchant for removing the dielectric layer 108 to avoid the passivation layer 120 being removed by the etchant. In addition, when the passivation layer 120 is constituted by the metal material, the dielectric layer 108 disposed between the passivation layer 120 and the bonding pads 116 or disposed between the passivation layer 120 and the metal-interconnect structures 112 can electrically insulate the passivation layer 120 from the bonding pads and the metal-interconnect structures 112 to prevent the logic devices 114 and the MEMS devices 110 from being unable to operate.

Figure 4A:
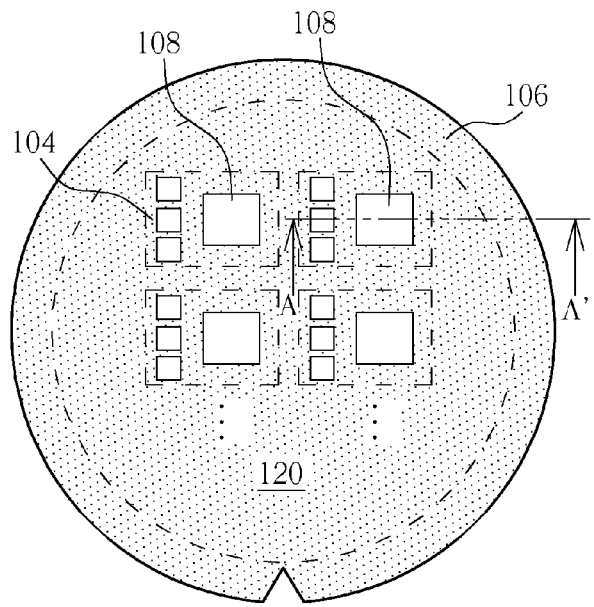
Figure 4B:
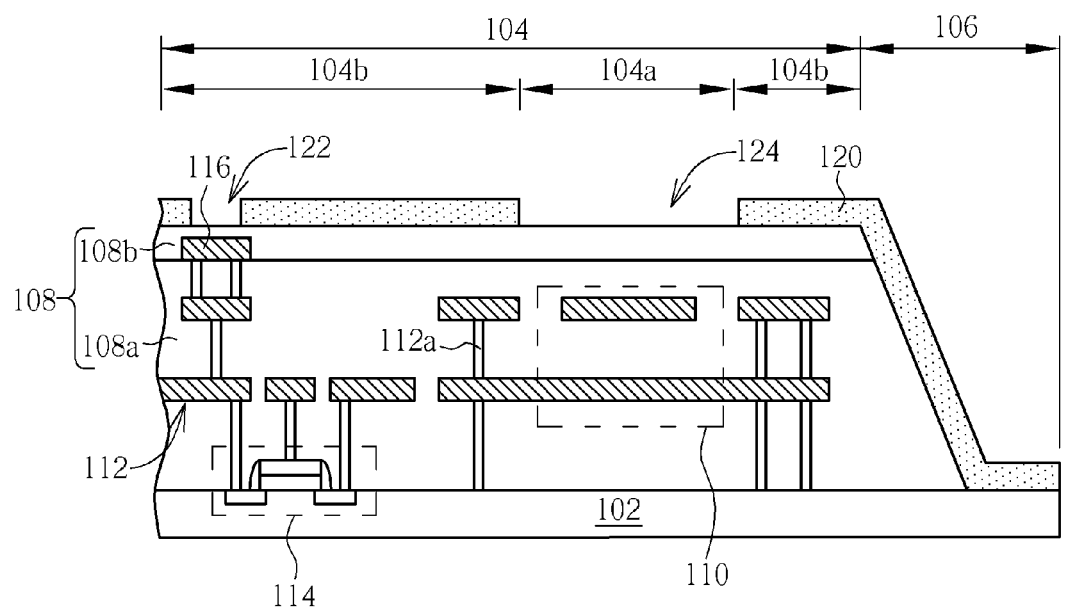

Subsequently, as shown in FIG. 4A and FIG. 4B, a photolithographic process and an etching process are performed to pattern the passivation layer 120, so that the passivation layer 120 has a plurality of first openings 122 and a plurality of second openings 124. Each first opening exposes the dielectric layer 108 disposed on each bonding pad 116 in each die region 104, and each second opening exposes the dielectric layer 108 in the MEMS region 104a of each die region 104.

Figure 5A:
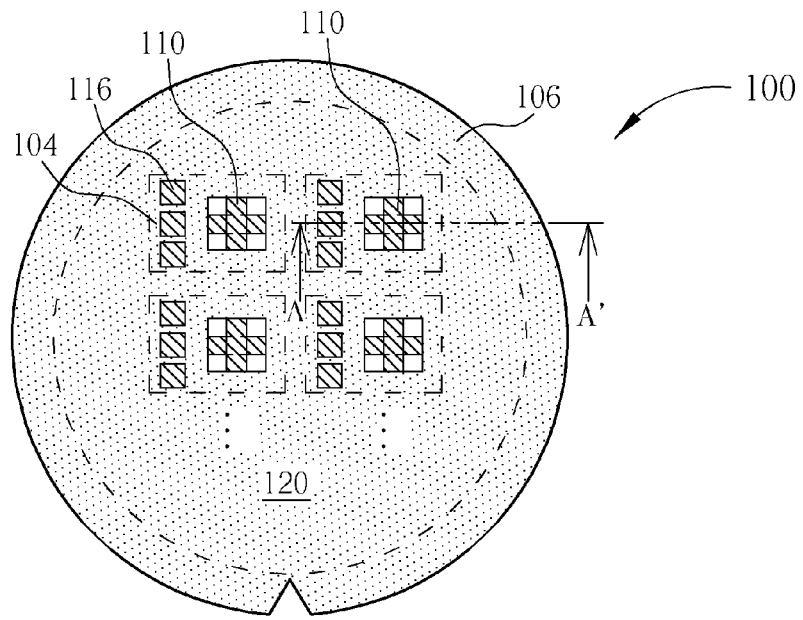
Figure 5B:
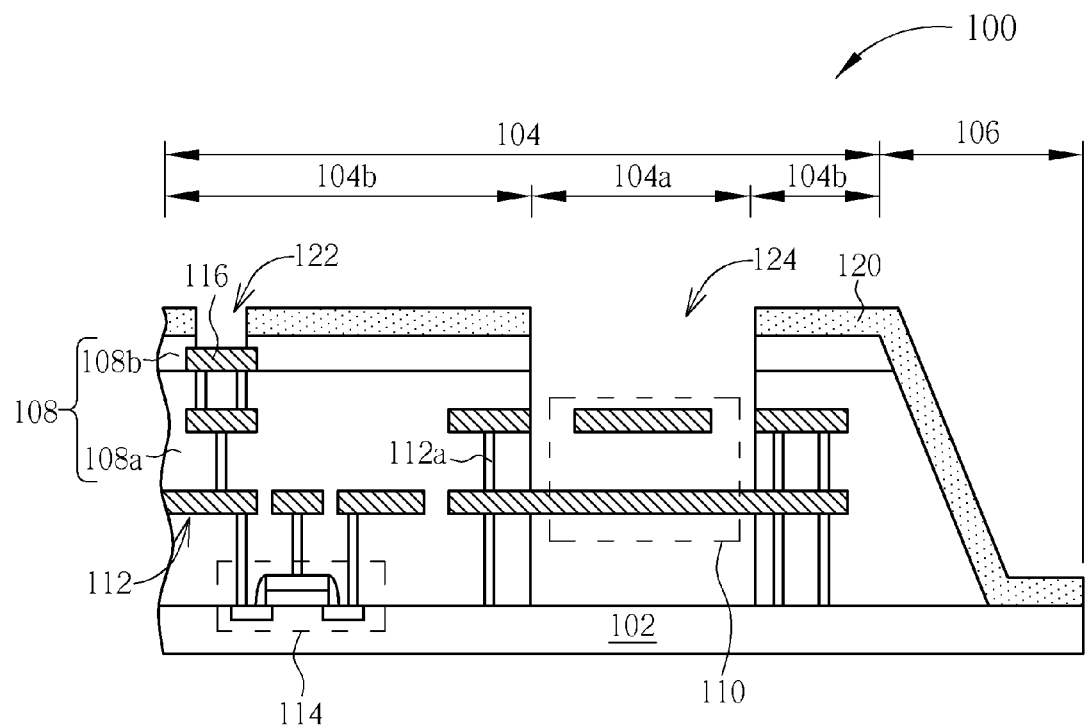

Next, as shown in FIG. 5A and FIG. 5B, an isotropic etching process is performed to remove the dielectric layer 108 disposed on each bonding pad 116 and the dielectric layer 108 disposed in the MEMS device 104a, so that the dielectric layer 108 also has the plurality of first openings 122 and the plurality of second openings 124. Each first opening 122 respectively exposes each bonding pad 116, and each second opening 124 respectively exposes the MEMS device 110 and the substrate 102 in each MEMS region 104a. The wafer structure 100 of this embodiment is completed. In this embodiment, the isotropic etching process can be a wet etching process, and the etchant used in the isotropic etching process has high etching selectivity ratio between the passivation layer 120 and the dielectric layer 108, such as hydrofluoric acid (HF), so that the etchant can only remove the dielectric layer 108 in the MEMS region 104a and the dielectric layer 108 on each bonding pad 116, but not remove the passivation layer 120 and the dielectric layer 108 in the non-MEMS regions 104b. For this reason, the MEMS devices 110 can have mechanical characteristics, and the metal-interconnect structures 112 and the logic devices 116 also can be protected.

It should be noted that the fabrication method of the wafer structure 100 in this embodiment first removes the dielectric layer 108 in the edge region 106 and forms the continuous passivation layer 120 on the top surface and the sidewall of the dielectric layer 108 and the substrate 102 before performing the isotropic etching process, so that the etchant used in the isotropic etching process do not etch the sidewall of the dielectric layer 108, and especially, the joint surface of the sidewall of the dielectric layer 108 and the substrate 102 can be prevented from being etched by the etchant. Therefore, the dielectric layer 108 at the edge of the substrate 102 and the structure disposed thereon can be prevented from being peeled off the substrate 102, and the MEMS device 110 can be prevented from being contaminated by peeled particles.

Figure 6:
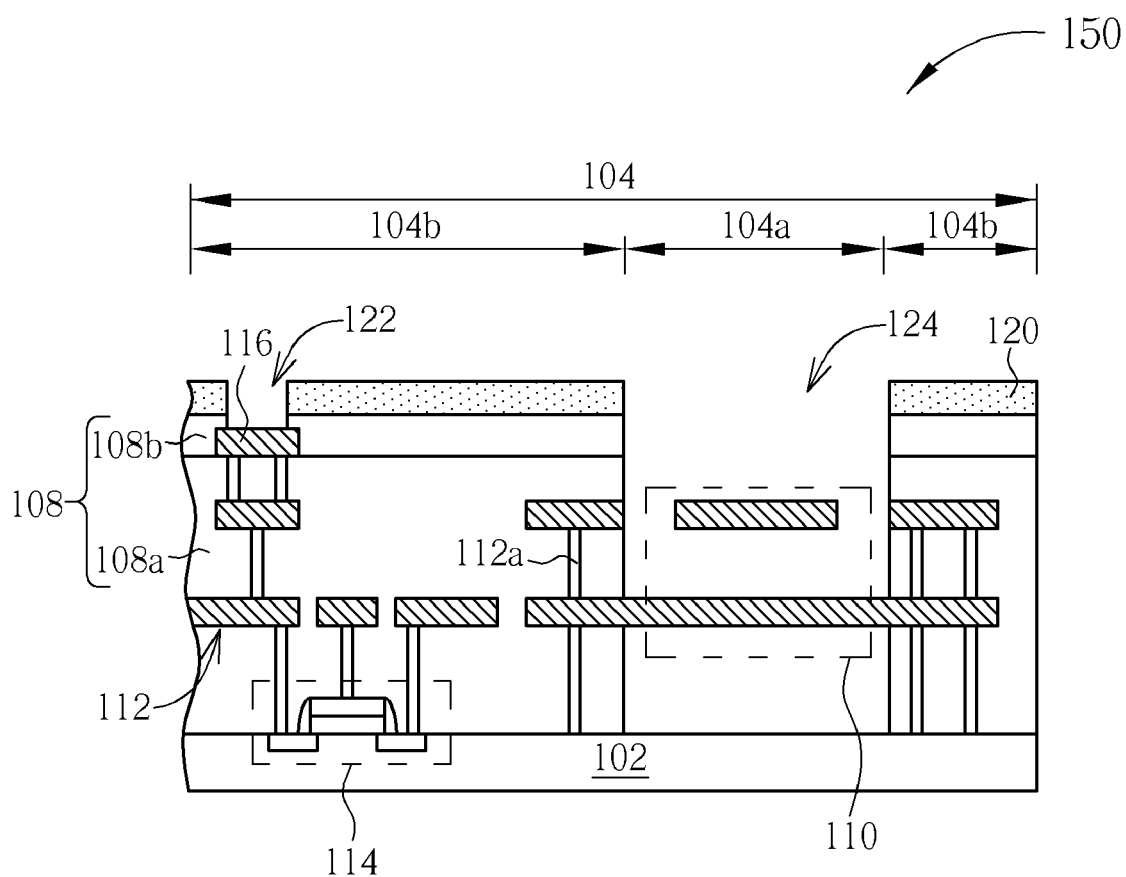
FIG. 6 is a schematic diagram illustrating a cross-sectional view of the semiconductor device according to a preferred embodiment of the present invention.

The present invention further provides a semiconductor device integrated with a MEMS device and a logic device. Please refer to FIG. 6, and refer to FIG. 5A and FIG. 5B together. FIG. 6 is a schematic diagram illustrating a cross-sectional view of the semiconductor device according to a preferred embodiment of the present invention. As shown in FIG. 5A, FIG. 5B and FIG. 6, a cutting process is further performed on the wafer structure 100, and structures in the die regions 104 can be divided. The structure in each die region 104 respectively constitutes a die type of a semiconductor device 150. In this embodiment, each semiconductor device 150 includes a substrate 102, a dielectric layer 108, a MEMS device 110, a metal-interconnect structure 112, a logic device 114, at least one bonding pad 116, and a passivation layer 120. The substrate 102 has a MEMS region 104a and a non-MEMS region 104b defined thereon, and the dielectric layer 108 only disposed on the substrate 102 in the non-MEMS region 104b. The metal-interconnect structure 112 and the bonding pad 116 are disposed in the dielectric layer. Furthermore, the dielectric layer has at least one first opening 122 exposing the bonding pad 116. The passivation layer 120 covers the dielectric layer 108, and has the same first opening 122 as the dielectric layer 108 exposing the bonding pad 116, so that the bonding pad 116 can be electrically connected to the outside through a wire-bonding process. The dielectric layer 108 and the passivation layer 120 have a second opening 124 exposing the MEMS device 110 in the MEMS region 104a. It should be noted that the passivation layer 120 includes a metal-atom-containing material, such as metal or metal nitride, such as TiN or TaN, etc., and the metal includes W, Al or Ti, etc. The present invention is not limited to this.

In summary, the fabrication method of the wafer structure in the present invention first removes the dielectric layer in the edge region and forms the passivation layer that can resist the etching of the etchant for etching the dielectric layer on the top surface and the sidewall of the dielectric layer and the substrate before performing the isotropic etching process, so that the etchant used in the isotropic etching process do not etch the sidewall of the dielectric layer. Therefore, the fabricated wafer structure and the semiconductor device do not have an issue of the dielectric layer at the edge of the substrate and the structure disposed thereon being peeled off the substrate, and the MEMS device in the fabricated wafer structure and the semiconductor device also can be prevented from being contaminated.

Those skilled in the art will readily observe that numerous modifications and alterations of the device and method may be made while retaining the teachings of the invention.

What is claimed is:

1. A wafer structure, comprising:
   a substrate, having a plurality of die regions and an edge region surrounding the die regions defined thereon;
   a dielectric layer, disposed on the substrate in the die regions, and having a plurality of first openings;
   a plurality of bonding pads, disposed in the dielectric layer in the die regions, and each first opening of the dielectric layer exposing each bonding pad; and
   a passivation layer, covering the dielectric layer and a sidewall of the dielectric layer in the edge region and extending to cover the substrate in the edge region.

2. The wafer structure according to claim 1, wherein the dielectric layer electrically insulates the passivation layer from the bonding pads.

3. The wafer structure according to claim 1, wherein each die region is divided into a MEMS region and a non-MEMS region, and the passivation layer and the dielectric layer have a plurality of second openings, respectively exposing each MEMS region.

4. The wafer structure according to claim 3, further comprising a plurality of MEMS devices and a plurality of metal-interconnect structures, each MEMS device respectively disposed on the substrate in each MEMS region, and each metal-interconnect structure respectively disposed in the dielectric layer of each non-MEMS region.

5. The wafer structure according to claim 4, wherein one of the metal-interconnect structures and an edge of the substrate have a first distance, a top end of the sidewall of the dielectric layer in the edge region and the edge of the substrate have a second distance, and the first distance is larger than the second distance.

6. The wafer structure according to claim 3, further comprising a plurality of logic devices, disposed in the non-MEMS regions.

7. The wafer structure according to claim 1, wherein the sidewall of the dielectric layer in the edge region is an inclined sidewall.

8. The wafer structure according to claim 1, wherein the passivation layer comprises metal, polyimide or metal nitride.

9. A semiconductor device, comprising:
  a substrate, having a MEMS region and a non-MEMS region disposed thereon;
  a dielectric layer, disposed on the substrate in the non-MEMS region, and having at least one opening;
  at least one bonding pad, disposed in the dielectric layer, and the opening exposing the bonding pad; and
  a passivation layer, covering the dielectric layer, wherein the passivation layer comprises a metal-atom-containing material, and is electrically insulated from the bonding pad.

10. The semiconductor device according to claim 9, wherein the metal-atom-containing material comprises metal or metal nitride.

11. The semiconductor device according to claim 10, wherein the metal comprises W, Al or Ti.

12. The semiconductor device according to claim 9, further comprising a metal-interconnect structure and a MEMS device, the metal-interconnect structure disposed in the dielectric layer of the non-MEMS region, and the MEMS device disposed on the substrate in the MEMS region.

13. The semiconductor device according to claim 9, further comprising a logic device, disposed in the non-MEMS region.

* * * * *